(12) United States Patent
Gleason et al.

(10) Patent No.: US 8,082,524 B2
(45) Date of Patent: Dec. 20, 2011

(54) MASK PATTERNS FOR USE IN MULTIPLE-EXPOSURE LITHOGRAPHY

(75) Inventors: Robert P. Gleason, San Carlos, CA (US); Timothy Lin, San Jose, CA (US); Andrew J. Moore, Keizer, OR (US); Bennett W. Olson, Campbell, CA (US); Paul Rissman, Palo Alto, CA (US)

(73) Assignee: Luminescent Technologies, Inc., Palo Alto, CA (US)

( * ) Notice: Subject to any disclaimer, the term of this patent is extended or adjusted under 35 U.S.C. 154(b) by 242 days.

(21) Appl. No.: 12/423,686

(22) Filed: Apr. 14, 2009

(65) Prior Publication Data
US 2009/0319978 A1    Dec. 24, 2009

Related U.S. Application Data

(60) Provisional application No. 61/045,201, filed on Apr. 15, 2008.

(51) Int. Cl.
G06F 17/50 (2006.01)
(52) U.S. Cl. .......... 716/50; 716/53; 716/54; 716/55
(58) Field of Classification Search .......... 716/50, 716/53, 54, 55
See application file for complete search history.

(56) References Cited

U.S. PATENT DOCUMENTS

| | | | |
|---|---|---|---|
| 6,042,998 A | 3/2000 | Brueck et al. | |
| 6,233,044 B1 * | 5/2001 | Brueck et al. | 355/67 |
| 6,320,648 B1 * | 11/2001 | Brueck et al. | 355/67 |
| 6,698,007 B2 | 2/2004 | Wu et al. | |
| 6,733,929 B2 | 5/2004 | Pierrat | |
| 6,787,271 B2 | 9/2004 | Cote | |
| 6,968,532 B2 | 11/2005 | Sivakumar et al. | |
| 7,124,394 B1 | 10/2006 | Abrams et al. | |
| 7,178,127 B2 | 2/2007 | Abrams et al. | |
| 7,441,227 B2 | 10/2008 | Abrams et al. | |
| 7,480,889 B2 | 1/2009 | Abrams et al. | |
| 7,571,423 B2 | 8/2009 | Abrams et al. | |
| 2003/0165749 A1 | 9/2003 | Fritze et al. | |
| 2004/0006757 A1 * | 1/2004 | Chen et al. | 716/19 |
| 2004/0166422 A1 | 8/2004 | Yamazoe et al. | |

(Continued)

OTHER PUBLICATIONS

Wang, Y-T, et al., "Automated design of halftoned double-exposure phase-shifting masks", Proc. SPIE vol. 2440 pp. 290-301 (1995).

*Primary Examiner* — Paul Dinh
*Assistant Examiner* — Brian Ngo
(74) *Attorney, Agent, or Firm* — Wilson Sonsini Goodrich & Rosati

(57) ABSTRACT

A method for determining mask patterns to be used on photomasks in a multiple-exposure photolithographic process is described. During the method, an initial mask pattern, which is intended for use in a single-exposure photolithographic process, and a target pattern that is to be printed are used to determine a first mask pattern and a second mask pattern, which are intended for use in the multiple-exposure photolithographic process. In particular, the first mask pattern includes a first feature and the second mask pattern includes a second feature, and the first feature and the second feature overlap an intersection between features in the initial mask pattern. Moreover, the first mask pattern and the second mask pattern have at least one decreased spatial frequency relative to the initial mask pattern along at least one direction in the initial mask pattern.

23 Claims, 8 Drawing Sheets

U.S. PATENT DOCUMENTS

| | | |
|---|---|---|
| 2004/0173737 A1* | 9/2004 | Shimomura et al. ..... 250/231.13 |
| 2004/0265707 A1 | 12/2004 | Socha |
| 2005/0031182 A1* | 2/2005 | Inoue ............................ 382/132 |
| 2005/0099614 A1* | 5/2005 | Sugita et al. .................... 355/53 |
| 2005/0122500 A1 | 6/2005 | Ye et al. |
| 2005/0287483 A1* | 12/2005 | Lercel et al. ................. 430/394 |
| 2007/0009808 A1 | 1/2007 | Abrams et al. |
| 2007/0011644 A1 | 1/2007 | Abrams et al. |
| 2007/0011645 A1 | 1/2007 | Abrams et al. |
| 2007/0011647 A1 | 1/2007 | Abrams et al. |
| 2007/0136716 A1 | 6/2007 | Abrams et al. |
| 2007/0184357 A1 | 8/2007 | Abrams et al. |
| 2007/0184369 A1* | 8/2007 | Abrams et al. .................. 430/30 |
| 2007/0186206 A1 | 8/2007 | Abrams et al. |
| 2007/0192756 A1 | 8/2007 | Abrams et al. |
| 2007/0198966 A1 | 8/2007 | Abrams et al. |

* cited by examiner

MASK PATTERNS FOR USE IN MULTIPLE-EXPOSURE LITHOGRAPHY

CROSS REFERENCE

This application claims the benefit of U.S. Provisional Application No. 61/045,201, filed Apr. 15, 2008, which application is incorporated herein by reference.

BACKGROUND OF THE INVENTION

1. Field of the Invention

The present invention relates to systems and techniques for determining mask patterns for photolithography processes that use photo-masks and write patterns for maskless-lithography processes that use write devices.

2. Related Art

Lithography processing represents an essential technology for manufacturing Integrated Circuits (IC) and Micro-Electro-Mechanical Systems (MEMS) and Nano-Electro-Mechanical Systems (NEMS). Lithographic techniques are used to define: patterns, geometries, features, shapes, etc. onto an integrated-circuit die, semiconductor wafer, or chips. These patterns are typically defined by: a set of contours, lines, boundaries, edges, curves, etc., which generally surround, enclose, and/or define the boundary of the various regions which constitute the patterns.

One existing lithographic technique is photolithography, in which images defined by photo-masks are printed onto an integrated-circuit die or one or more semiconductor wafers. Furthermore, another existing lithographic technique is maskless lithography, in which a write device directly prints a write pattern onto the integrated-circuit die or the one or more semiconductor wafers, thereby eliminating the need for photo-masks. Unfortunately, it is increasingly difficult to determine the write patterns, or to design and manufacture photo-masks.

In particular, demand for increased density of features on the integrated-circuit die and the one or more semiconductor wafers has resulted in the design of circuits with decreasing minimum dimensions. These trends have significantly increased the complexity of the computations necessary to determine the write patterns and/or the mask patterns (to which the photo-masks correspond), with a commensurate impact on computation time, processing requirements, and expense.

Furthermore, due to the wave nature of light, as dimensions approach sizes comparable to the wavelength of the light used in the photolithography processes, the resulting wafer patterns deviate from the corresponding photo-mask patterns and are accompanied by unwanted distortions and artifacts. Existing techniques (such as Optical Proximity Correction or OPC, and resolution enhancement technologies or RET) are used to pre-distort the mask patterns to improve resolution and/or a process window (e.g., a range of process conditions that result in acceptable yield) in a photolithography process. While these techniques may ensure that the wafer pattern is printed more accurately, determining the pre-distorted mask patterns is increasingly difficult, thereby exacerbating the computational complexity and the associated problems.

Additional techniques to increase the resolution (or decrease the critical dimension) for a given wavelength of light and/or to improve process control include multiple-exposure lithography. For example, a wafer pattern may be printed by sequentially exposing and/or patterning a wafer using photo-masks (which correspond to mask patterns) that represent a decomposition of a photo-mask used in a corresponding single-exposure photolithographic process. Unfortunately, it is very difficult to perform this decomposition for an arbitrary mask pattern or write pattern.

Hence, what is needed is a method and an apparatus that facilitates determination of write patterns and mask patterns without the above-described problems.

SUMMARY OF THE INVENTION

One embodiment of the present invention provides a method for determining mask patterns to be used on photo-masks in a multiple-exposure photolithographic process. During the method, a target pattern is received or obtained. Then, a critical region in an initial mask pattern is identified. Note that an initial photo-mask, which corresponds to the initial mask pattern, may be configured to print a wafer pattern, which corresponds to the target pattern, during a single-exposure photolithographic process. Next, a first mask pattern and a second mask pattern are determined based on the initial mask pattern and the target pattern, where the first mask pattern and the second mask pattern have at least one decreased spatial frequency relative to the initial mask pattern along at least one direction in the initial mask pattern. Moreover, the first mask pattern may include a first feature and the second mask pattern may include a second feature, and the first feature and the second feature may overlap an intersection between features proximate to the critical region in the initial mask pattern. Additionally, a first photo-mask corresponding to the first mask pattern and a second photo-mask corresponding to the second mask pattern may be configured to print another wafer pattern, which corresponds to the target pattern, during the multiple-exposure photolithographic process.

In some embodiments, the initial mask pattern is received, obtained, or determined.

In some embodiments, identifying the critical region involves analysis of spatial frequency components in the initial mask pattern. This analysis of the spatial frequency components may involve identifying a maximum spatial frequency in the initial mask pattern and/or identifying at least the one direction in the initial mask pattern.

In some embodiments, the multiple-exposure photolithographic process includes a double-exposure photolithographic process in which the other wafer pattern is to be printed by sequentially exposing a wafer using the first photo-mask and, then, the second photo-mask. Alternatively, the multiple-exposure photolithographic process may include a double-patterning photolithographic process in which the other wafer pattern is to be printed by sequentially exposing, developing and etching a wafer using the first photo-mask and, then, the second photo-mask.

In some embodiments, the amount of overlap is based on an optical interaction length in the multiple-exposure photolithographic process. For example, the optical interaction length may correspond to a ratio of a wavelength of a light source in the multiple-exposure photolithographic process and a numerical aperture in an optical path in the multiple-exposure photolithographic process.

In some embodiments, a first region in the first mask pattern has a first weight and a second region in the second mask pattern has a second weight, where the first region and the second region correspond to the critical region. Moreover, the first weight and the second weight may determine relative contributions of the first mask pattern and the second mask pattern to the other wafer pattern during the multiple-exposure photolithographic process. For example, the first weight and the second weight may each be approximately 50%.

However, in some embodiments the first weight and the second weight are different than each other, and are each less than 100%.

Note that the first weight and the second weight may be associated with sizes of features in the first region and the second region.

In some embodiments, weights outside of the first region in the first mask pattern and the second region in the second mask pattern are each approximately 100%.

In some embodiments, the first mask pattern includes predominantly features along a first direction in the initial mask pattern, and the second mask pattern includes predominantly features along a second direction in the initial mask pattern. For example, the first direction and the second direction may be approximately perpendicular.

In some embodiments, the features in the initial mask pattern include a first portion of a feature and a second portion of the feature. Moreover, the intersection of the features in the initial mask pattern may include a boundary separating the first portion of the feature and the second portion of the feature.

In some embodiments, the first mask pattern and the second mask pattern are determined using an inverse optical calculation based on the target pattern and a model of the optical path that corresponds to an optical system in the multiple-exposure photolithographic process. Note that the target pattern may be at an image plane in the model of the optical path, and that the first mask pattern and the second mask pattern may be at an object plane in the model of the optical path. Moreover, the first mask pattern and the second mask pattern may be determined based on an estimate of the other wafer pattern, and the estimate of the other wafer pattern may be at an image plane in the model of the optical path. Furthermore, the estimate of the other wafer pattern may be based on a model of a photo-resist used in the multiple-exposure photolithographic process.

Another embodiment provides a computer system configured to execute instructions corresponding to at least some of the above-described operations.

Another embodiment provides a computer-program product for use in conjunction with the computer system.

Another embodiment provides a semiconductor wafer. This semiconductor wafer is produced in the multiple-exposure photolithography process that uses the first photo-mask and the second photo-mask.

Another embodiment provides the first photo-mask and the second photo-mask.

Another embodiment provides a data file stored in a computer-readable memory that includes information corresponding to the first mask pattern and the second mask pattern.

Another embodiment provides a method for determining write patterns to be used in a multiple-write maskless lithographic process. During the method, a target pattern is received or obtained. Then, a critical region associated with an initial write pattern is identified. Note that the initial write pattern may be configured to generate an initial wafer pattern, which corresponds to the target pattern, during a single-write maskless lithographic process. Next a first write pattern and a second write pattern are determined based on the initial write pattern and the target pattern, where the first write pattern and the second write pattern have at least one decreased spatial frequency relative to the initial write pattern along at least one direction in the initial write pattern. Moreover, the first write pattern may be configured to generate a first feature and the second mask pattern may be configured to generate a second feature, and the first feature and the second feature may overlap an intersection between features proximate to the critical region associated with the initial write pattern. Additionally, the first write pattern and the second write pattern may be configured to generate another wafer pattern, which corresponds to the target pattern, during the multiple-write maskless lithographic process.

Another embodiment provides another data file stored in a computer-readable memory that includes information corresponding to the first write pattern and the second write pattern.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

Note that like reference numerals refer to corresponding parts throughout the drawings.

DETAILED DESCRIPTION OF THE INVENTION

Figure 1:
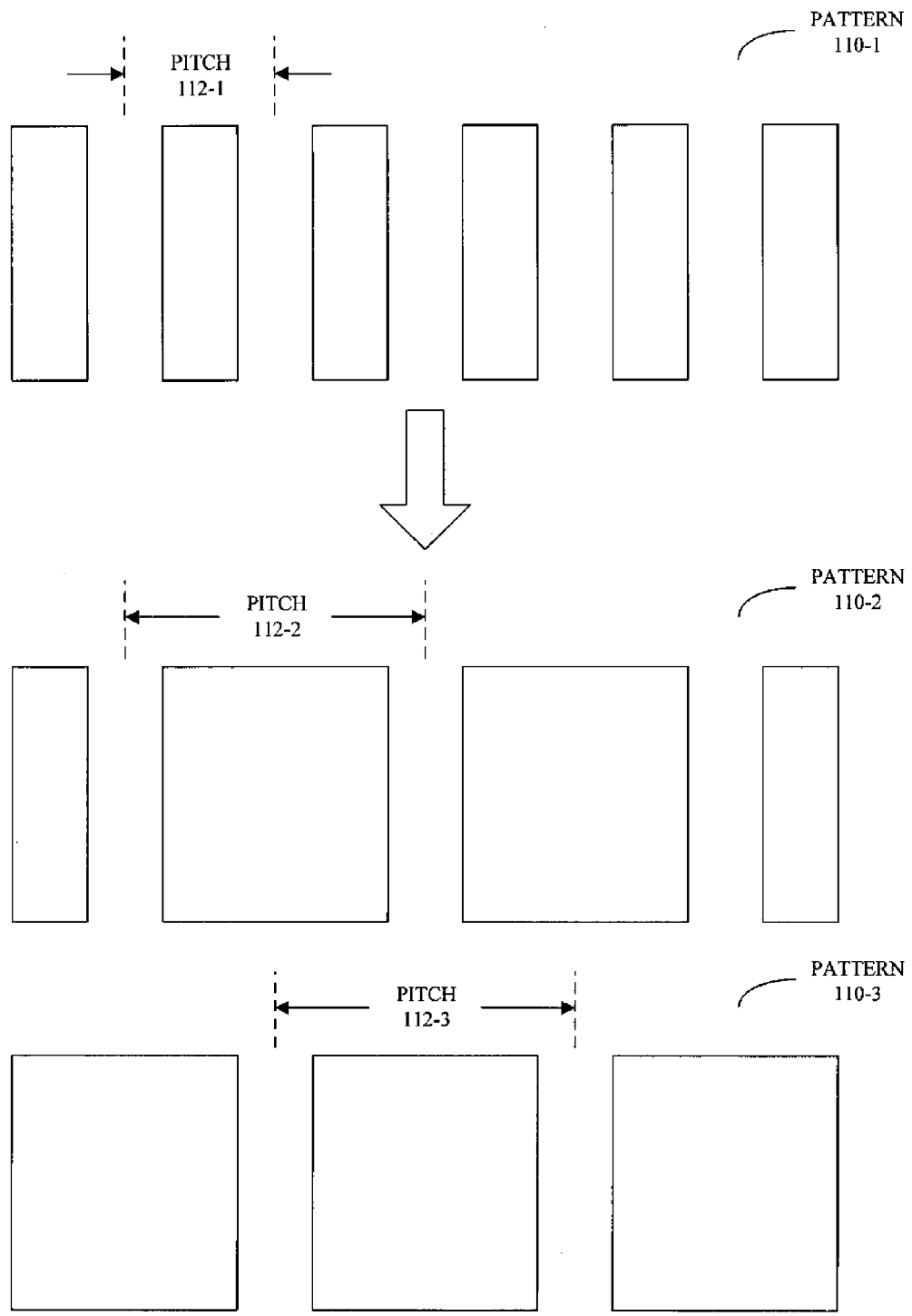
FIG. 1 is a block diagram illustrating patterns in accordance with an embodiment of the present invention.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a computer system, a process, a computer program product (i.e., software), and a data structure or a file for use with the computer system are described. These systems, processes, and/or data structures may be used to determine or generate mask patterns that are used to produce photo-masks, which in turn are used to produce integrated-circuit die and/or semiconductor wafers (henceforth referred to as semiconductor wafers) during a multiple-exposure photolithographic process. Moreover, in some embodiments the systems, processes, and/or data structures are used to determine or generate write patterns that are used to produce the semiconductor wafers during a multiple-write maskless-lithographic process (such as a process that uses a direct write device). In particular, the photo-masks may be used to print a target pattern corresponding to a design (such as a design layer in an integrated circuit) onto a semiconductor wafer. Alternatively, the write device (such as a laser writer or an e-beam writer) may use the write patterns to write the target pattern onto the semiconductor wafer.

In some embodiments of the process, an initial mask pattern, which is intended for use in a single-exposure photolithographic process, and the target pattern that is to be printed are used to determine a first mask pattern and a second mask pattern, which are intended for use in the multiple-exposure photolithographic process. For example, the first mask pattern and the second mask pattern may be determined using an inverse optical calculation based on the target pattern and a model of an optical path that corresponds to an optical system in the multiple-exposure photolithographic process. Moreover, the target pattern may be at an image plane in the model of the optical path, and the first mask pattern and the second mask pattern may be at an object plane in the model of the optical path.

Note that the first mask pattern may include a first feature and the second mask pattern includes a second feature, and the first feature and the second feature may overlap an intersection between features in the initial mask pattern, which is proximate to (or in) a critical region in the initial mask pattern. For example, the first mask pattern and the second mask pattern may have at least one decreased spatial frequency relative to the initial mask pattern along at least one direction in the initial mask pattern. Alternatively, the first mask pattern may include predominantly features along a first direction in the initial mask pattern, and the second mask pattern may include predominantly features along a second direction in the initial mask pattern (such as a direction that is approximately perpendicular to the first direction).

Similarly, in some embodiments of the process an initial write pattern, which is intended for use during a single-write maskless lithographic process, and the target pattern are used to determine a first write pattern and a second write pattern, which are intended for use in the multiple-write maskless lithographic process. Additionally, in some embodiments such a first write pattern and a second write pattern are determined for use in manufacturing a photo-mask.

Note that the multiple-exposure photolithographic process may include a double-exposure photolithographic process in which a wafer pattern is printed by sequentially exposing a wafer using the first photo-mask (which corresponds to the first mask pattern) and, then, the second photo-mask (which corresponds to the second mask pattern), or a double-patterning photolithographic process in which the wafer pattern is printed by sequentially exposing, developing and etching the wafer using the first photo-mask and, then, the second photo-mask. Moreover, note that the first mask pattern and the second mask pattern may correspond to bright-field and/or dark-field photo-masks, which can be loosely defined as those in which apertures or openings are, respectively, less than or more than 50% of the surface area of a given mask pattern.

Similarly, in some embodiments the multiple-write maskless lithographic process may include a double-write lithographic process in which a wafer pattern is printed by sequentially writing a wafer using the first write pattern and, then, the second write pattern, or a double-patterning lithographic process in which the wafer pattern is printed by sequentially writing and developing the wafer using the first write pattern and, then, the second write pattern. Moreover, note that the first write pattern and the second write pattern may correspond to bright-field and/or dark-field write patterns, which can be loosely defined as those in which a write pattern writes features or the absence of features, respectively, in the target pattern.

By decomposing the initial mask pattern and/or the initial write pattern, these techniques facilitate lithographic processes with increased resolution (or a decreased critical dimension) for a given wavelength of light and a given optical path, and/or improved process control (such as control of line shortening). Consequently, these techniques may result in increased manufacturing yields and/or lower semiconductor-wafer costs.

We now describe embodiments of a system and a technique for determining mask patterns and/or write patterns. In the discussion that follows, mask patterns for use in a multiple-exposure photolithographic process are used as illustrative examples of techniques that can also be applied to determine write patterns for use in a multiple-write maskless lithographic process.

FIG. 1 presents a block diagram illustrating an embodiment of patterns 110, which can include a mask pattern that corresponds to a target pattern. Pattern 110-1 shows a constant frequency pattern with a pitch 112-1. One half of pitch 112-1 is a minimum feature size (which is equivalent to the critical dimension or resolution) in pattern 110-1. In existing photolithographic systems, the minimum feature size for dense features (such as the constant frequency in pattern 110-1) equals $k1 \lambda /NA$, where k1 is a factor associated with a photolithographic process that determines the resolution, NA is the numerical aperture of the optical path in a photolithographic system and $\lambda$ is the wavelength of light provided by a light source. For example, for $k1=0.3$, $NA=1.2$, $\lambda=193$ nm, the minimum feature size is 48 nm.

In principle, decomposing pattern 110-1 into at least two lower resolution patterns 110-2 and 110-3 allows a smaller minimum feature size to be printed during a multiple-exposure photolithographic process. Note that in patterns 110-2 and 110-3, pitches 112-2 and 112-3 are twice as large as pitch 112-1. Consequently, a double-exposure process based on patterns 110-2 and 110-3 can image 48 nm lines if $k1=0.6$. Alternatively, if $k1=0.3$, the minimum feature size is 24 nm.

Figure 2:
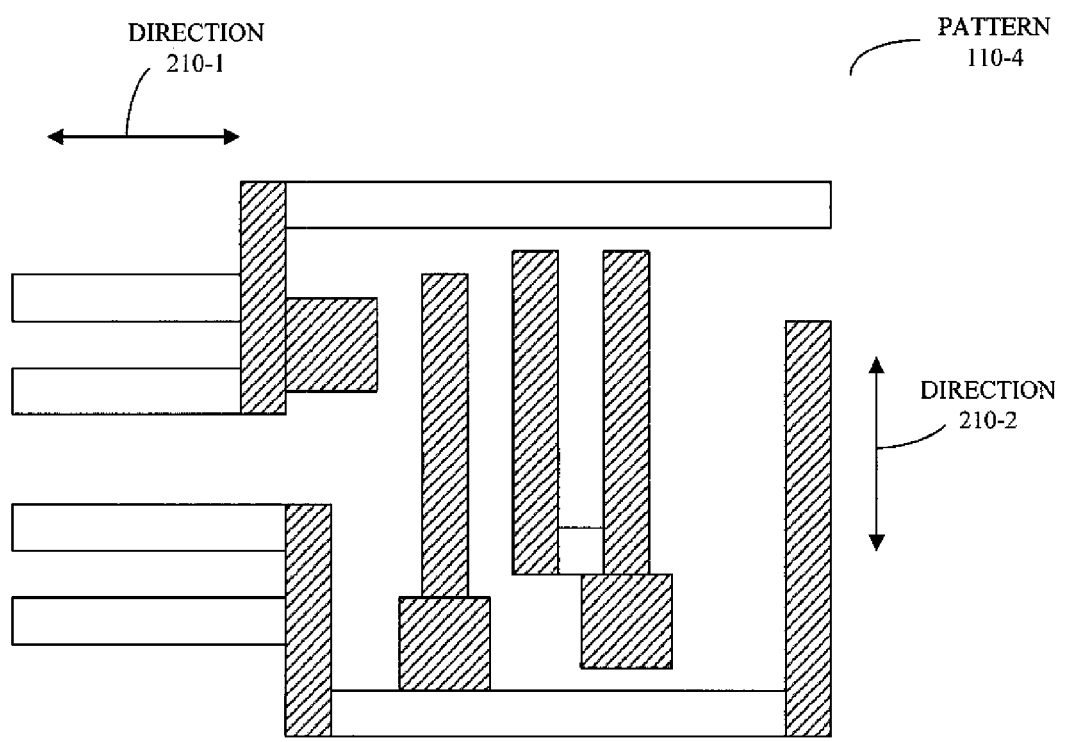
FIG. 2 is a block diagram illustrating patterns in accordance with an embodiment of the present invention.

However, pattern 110-1 is fairly simple, which facilitates the decomposition. In general, patterns are more complicated, which makes decomposing an initial pattern, such as pattern 110-4 (FIG. 2), more challenging. As shown in FIG. 2, which presents a block diagram illustrating an embodiment of patterns (such as a mask pattern that corresponds to a target pattern), pattern 110-4 may be decomposed into sub-patterns, such as two patterns: a first pattern that includes open features, and a second pattern that includes cross-hatched features. Note that the first pattern includes predominantly features along a direction 210-1 in the pattern 110-4, and the second pattern includes predominantly features along a direction 210-2 in the pattern 110-4. Moreover, note that directions 210 may be approximately perpendicular to each other. Consequently, the corresponding first pattern and the second pattern may be printed using vertical and horizontal dipoles, respectively, in polarized light. This may offer improved process control relative to an annular exposure.

Unfortunately, the decomposition illustrated in FIG. 2 also poses significant challenges, including: overlay or alignment of photo-masks corresponding to the first pattern and the second pattern during a multiple-exposure photolithographic process; and boundary problems (such as line-end shortening) at interfaces between the first pattern and the second pattern. Additionally, because of non-linearities during the multiple-exposure photolithographic process (such as those associated with a photo-resist), the wafer pattern that results when a photo-mask corresponding to pattern 110-4 is used can be different than the wafer pattern that results when photo-masks corresponding to the first pattern and the second pattern are applied sequentially. Consequently, it is very difficult to determine how to decompose an arbitrary pattern (such as one associated with a logic circuit) to achieve improved resolution and/or process control, and it may be necessary to modify the resulting sub-patterns (relative to the features in the initial pattern) in order to print the target pattern within allowed tolerances.

In the discussion that follows, embodiments of a technique for decomposing an initial pattern (such as a mask pattern or a write pattern) are described. In this technique, the decomposition is, at least in part, focused on so-called critical regions in the initial pattern. Note that critical regions may include: locations in the initial pattern that are difficult to print in a single-exposure or single-write lithographic process (for example, the resulting wafer pattern may violate a design rule or exceed a process window); features in the initial pattern that are associated with a dominant direction in the initial pattern (such as a series of parallel lines); one or more interfaces or intersections between features in sub-pattern decompositions; and/or where there is an intersection with another layer in a design (for example, polysilicon over an island or an active layer). Moreover, in an example embodiment, the sub-patterns may be determined using an inverse calculation (such as so-called inverse lithography, which is described further below), which suitably modifies features in the sub-patterns so that the resulting wafer pattern is printed within the tolerances (and, more generally, the process window) relative to the target pattern.

Figure 3:
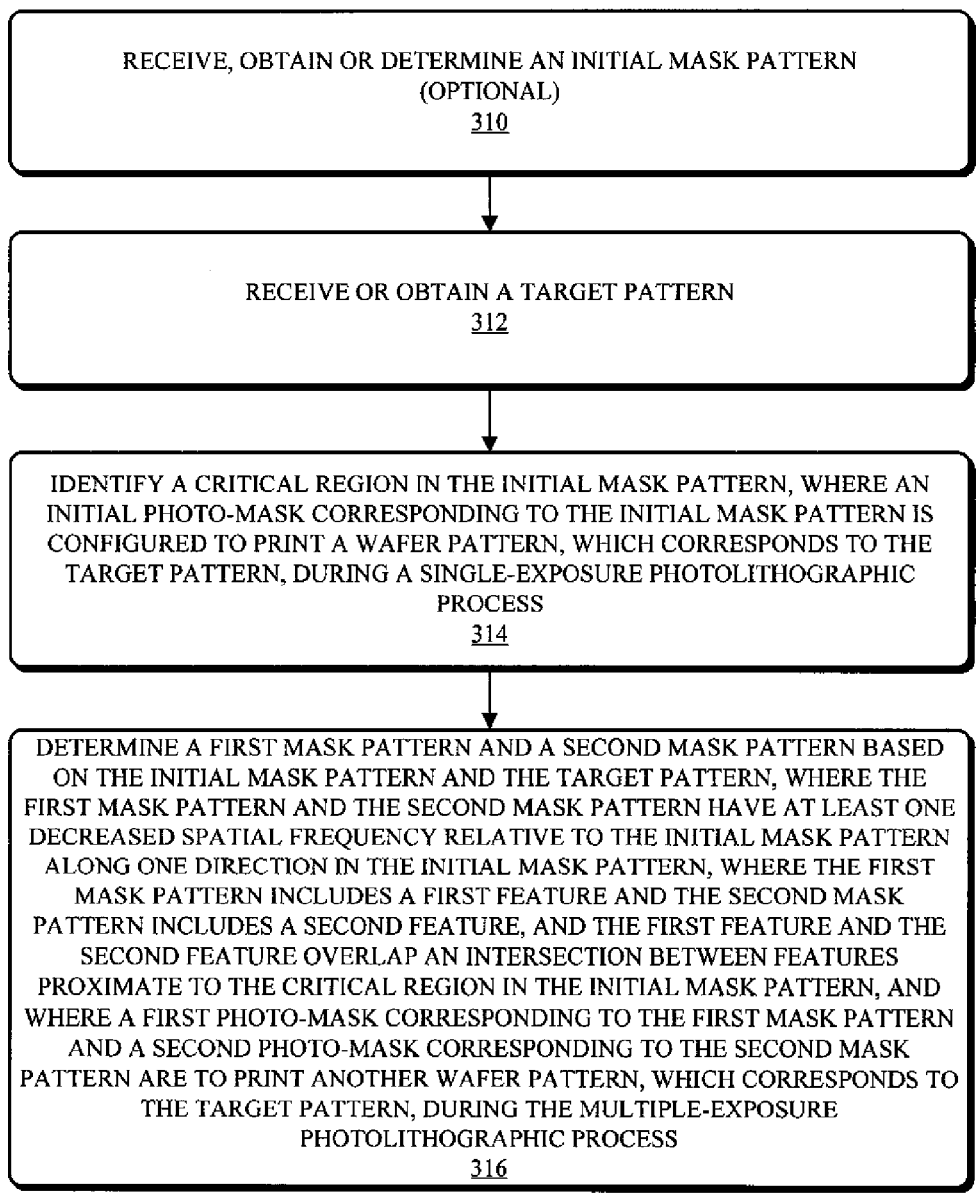
FIG. 3 is a flow chart illustrating a process for determining mask patterns in accordance with an embodiment of the present invention.

FIG. 3 presents a flow chart illustrating a process 300 for determining mask patterns, which may be implemented by a computer system. During this process, the computer system may optionally receive, obtain or determine an initial mask pattern (310), and may receive or obtain a target pattern (312). Next, the computer system may identify a critical region in the initial mask pattern (314). (As described below with reference to FIG. 6, the critical region may be identified using Fourier analysis.) Note that an initial photo-mask, which corresponds to the initial mask pattern, may be configured to print a wafer pattern, which corresponds to the target pattern, during a single-exposure photolithographic process.

Then, the computer system may determine a first mask pattern and a second mask pattern based on the initial mask pattern and the target pattern (316), where the first mask pattern and the second mask pattern may have at least one decreased spatial frequency relative to the initial mask pattern along at least one direction in the initial mask pattern. Moreover, the first mask pattern may include a first feature and the second mask pattern may include a second feature, and the first feature and the second feature may overlap an intersection between features proximate to the critical region in the initial mask pattern. Additionally, a first photo-mask corresponding to the first mask pattern and a second photo-mask corresponding to the second mask pattern may be configured to print another wafer pattern, which corresponds to the target pattern, during a multiple-exposure photolithographic process.

Figure 4:
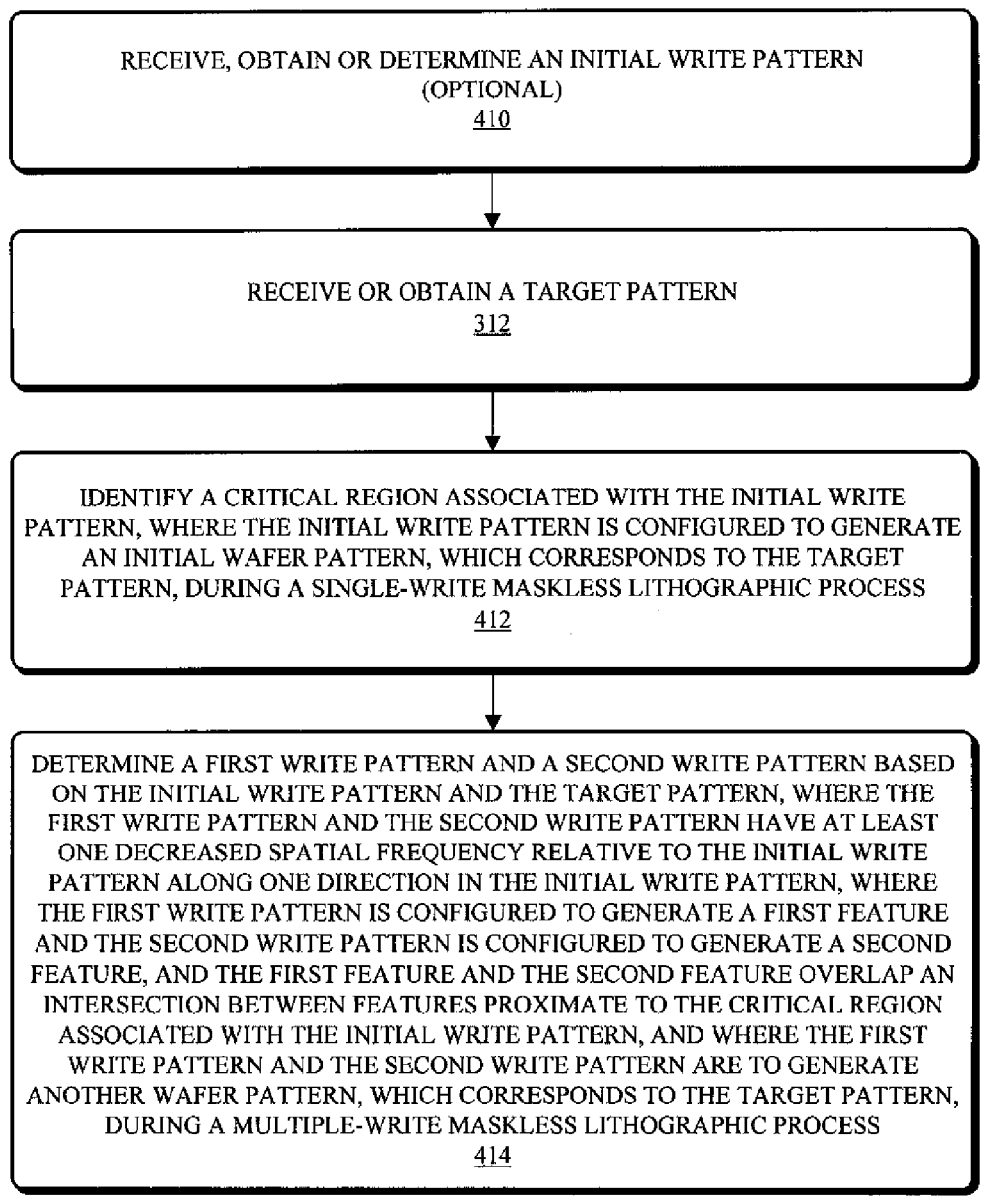
FIG. 4 is a flow chart illustrating a process for determining write patterns in accordance with an embodiment of the present invention.

FIG. 4 presents a flow chart illustrating a process 400 for determining write patterns, which may be implemented by a computer system. During this process, the computer system may optionally receive, obtain or determine an initial write pattern (410), and may receive or obtain a target pattern (312). Next, the computer system may identify a critical region associated with an initial write pattern (412). Note that the initial write pattern may be configured to generate an initial wafer pattern, which corresponds to the target pattern, during a single-write maskless lithographic process.

Then, the computer system may determine a first write pattern and a second write pattern based on the initial write pattern and the target pattern (414), where the first write pattern and the second write pattern may have at least one decreased spatial frequency relative to the initial write pattern along at least one direction in the initial write pattern. Moreover, the first write pattern may be configured to generate a first feature and the second mask pattern may be configured to generate a second feature, and the first feature and the second feature may overlap an intersection between features proximate to the critical region associated with the initial write pattern. Additionally, the first write pattern and the second write pattern may be configured to generate another wafer pattern, which corresponds to the target pattern, during the multiple-write maskless lithographic process.

Note that in some embodiments of the process 300 (FIG. 3) and/or the process 400 there may be additional or fewer operations. Moreover, the order of the operations may be changed, and two or more operations may be combined into a single operation.

Figure 5A:
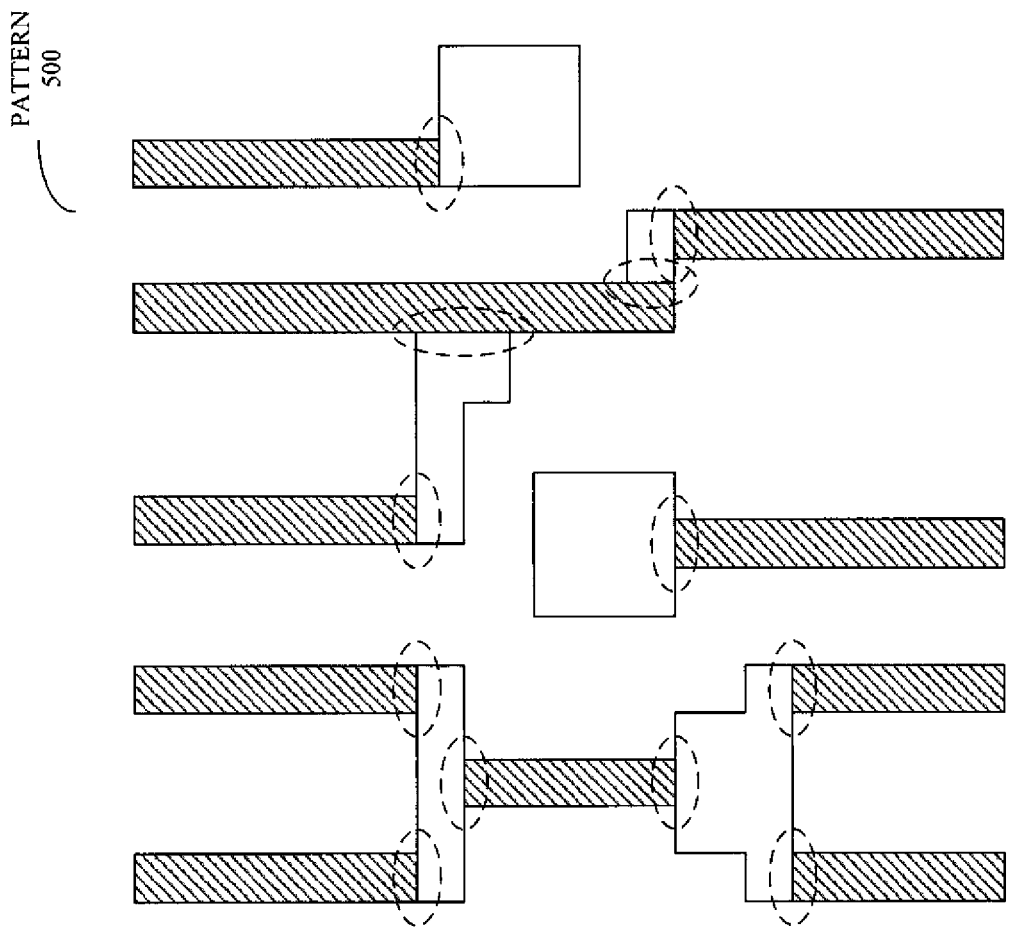
FIG. 5A is a block diagram illustrating patterns in accordance with an embodiment of the present invention.

We now describe several example embodiments of the decomposition technique. FIG. 5A presents a block diagram illustrating an embodiment of patterns, which can include a mask pattern that corresponds to a target pattern (for example, an XOR gate). As shown in this figure, pattern 500 may be decomposed into at least two sub-patterns: a first pattern that includes open features (such as feature 514-1), and a second pattern that includes cross-hatched features (such as feature 512-1). Note that these patterns may be approximately aligned along perpendicular directions in pattern 500 and, consequently, may be printed using vertical and horizontal dipoles, respectively, in polarized light.

In some embodiments the first pattern and the second pattern have at least one decreased spatial frequency relative to the pattern 500 along at least one direction in pattern 500. This may allow an effective k1 during the multiple-exposure photolithographic process to be less than 0.3. Additionally and/or separately, at least one of the first pattern and the second pattern may have features along a dominant axis or direction in pattern 500. As noted previously, this may allow the use of dipole illumination with polarized light to increase the modulation transfer function of the corresponding photo-mask(s), which can improve the manufacturability (e.g., the yield) of the resulting semiconductor die.

During the determination of the sub-patterns, one or more critical regions in pattern 500 may be determined. For pattern 500, the critical regions may include the vertical features, such as feature 512-1. (In a CMOS gate layer, the critical regions may include locations where gates cross active areas or all of those areas extended in one dimension.) Alternatively, the critical regions may include intersections, such as intersection 516-1 between feature 512-1 and feature 514-1. As described below with reference to FIG. 6, the one or more critical regions may be determined using Fourier analysis, which can be used to determine one or more dominant axes in pattern 500 (in which case, the critical regions may include features that are predominantly along one of the dominant axes) and/or a maximum spatial frequency along at least one of the dominant axes (in which case, the critical regions may be associated with the maximum spatial frequency).

In some embodiments, there is at least partial overlap (which can include edge-to-edge contact and/or a common area) of features in the sub-patterns that are proximate to (for example, adjacent to or in one of the critical regions), such as at intersection 516-1. The amount of overlap may be based on an optical interaction length in the multiple-exposure photo-lithographic process. For example, the optical interaction length may correspond to a ratio of a wavelength ($\lambda$) of a light source in the multiple-exposure photolithographic process and a numerical aperture (NA) in an optical path in the multiple-exposure photolithographic process. In some embodiments, the wavelength ($\lambda$) may correspond to a fundamental component of a light source in the multiple-exposure photolithographic process (or a source in a multiple-write maskless lithographic process).

In an example embodiment, the optical interaction length is 3-5 times the wavelength ($\lambda$). For example, the wavelength ($\lambda$) may be 193 nm and the overlap may be 800 nm. More generally, the optical interaction length may be $$\frac{n}{m} \cdot \frac{\lambda}{NA},$$

where n and m are positive integers. Note that in some embodiments the source includes: one or more lamps (including I line, g line, a wavelength of 193 nm, a wavelength of 248 nm, immersion, and/or any other optical lithography wavelength in air, water, or another fluid or gas), a laser, and/or an electron-beam source. Moreover, the source may be configured to provide: off-axis illumination, dipole illumination, quadrupole illumination, quasar illumination, incoherent illumination, coherent illumination, and/or any arbitrary illumination pattern.

Figure 5B:
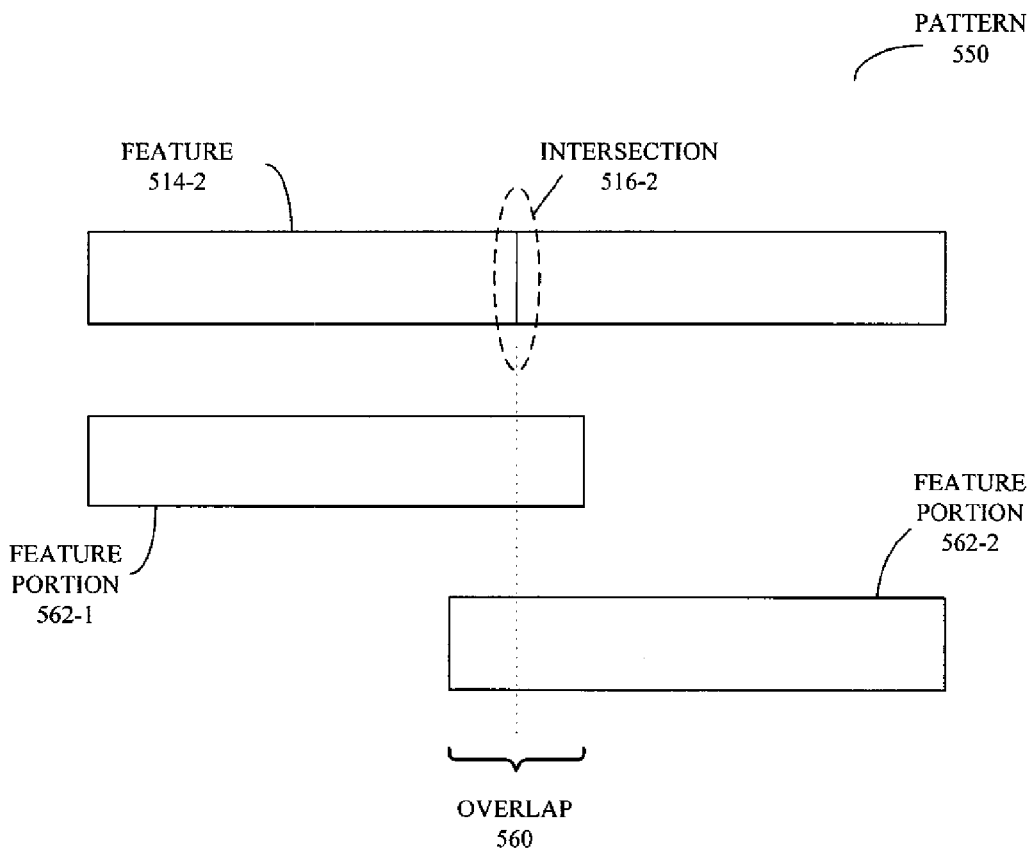
FIG. 5B is a block diagram illustrating patterns in accordance with an embodiment of the present invention.

In some embodiments, an intersection can occur in the middle of a feature (such as a line). This is shown in FIG. 5B, which presents a block diagram illustrating an embodiment of mask patterns. In particular, feature 514-2 can be decomposed into sub-patterns that, respectively, include one or the other of feature portions 562. Note that overlap 560 of these portions can be used to reduce or eliminate effects such as line-edge shortening, which may occur if overlap 562 were zero.

Referring back to FIG. 5A, in general a variety of decompositions may be used for a given pattern, such as pattern 500. For example, critical regions may be included in one of the sub-patterns (such as the first pattern) and the remainder of pattern 500 (i.e., the non-critical regions) may be included in the other sub-pattern (such as the second pattern). Alternatively, the critical regions may be included in both of the sub-patterns. In general, pattern 500 can be decomposed opportunistically, for example, to improve process control. Overall, the intent is to be able to improve and/or optimize the photo-lithography associated with photo-masks corresponding to the first pattern and the second pattern to produce the desired wafer patterns without artifacts (such as locations with poor lithography or bulges at the intersections, for example, at intersection 516-1).

Note that the sub-patterns are subsequently 'merged' during the photolithographic process, i.e., when the wafer is sequentially exposed and/or patterned using aerial images provided by photo-masks corresponding to the first pattern and the second pattern. In some embodiments, relative contributions of the first pattern and the second pattern to the resulting wafer pattern may be selected based on weighting of these sub-patterns. For example, different weights may be used in portions of the first pattern and/or portions of the second pattern. These different weights may be based on a size of features in regions in these patterns. Alternatively, the weights may be associated with a partial intensity of light transmission.

In an example embodiment, the weights in the first pattern and the second pattern may each be 50% where there is overlap between these patterns (for example, at intersections, such as intersection 516-2 in FIG. 5B), and may each be 100% everywhere else. In another example embodiment, the weights in the critical regions may be 50% and the remainder of the first pattern and the second pattern may have weights of 100%. In yet another example embodiment, weights in the critical regions in the first pattern and the second pattern may be different than each other, and may each be less than 100%.

Note that patterns 500 and 550 (FIG. 5B) may include fewer components or additional components. Moreover, two or more components may be combined into a single component, and/or a position of one or more components may be changed.

Figure 6:
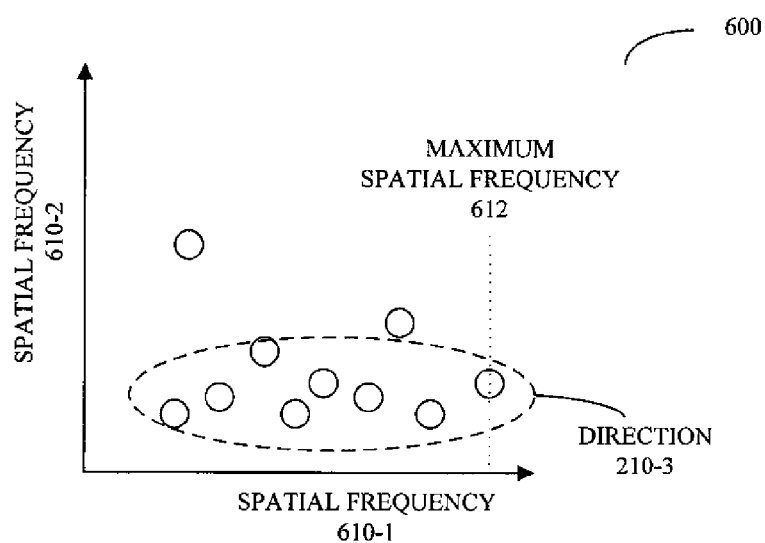
FIG. 6 is a graph illustrating spatial frequencies in a mask pattern in accordance with an embodiment of the present invention.

As noted previously, one or more critical regions in a given mask pattern (or a given write pattern) may be identified, at least in part, using Fourier analysis. This is shown in FIG. 6, which presents a graph 600 illustrating spatial frequencies 610 in a mask pattern. Note that the graph 600 allows a dominant direction 210-3 to be identified, as well as a maximum spatial frequency 612 along this direction. As was also noted previously, these characteristics of the mask pattern may be used when decomposing the mask pattern into two or more sub-patterns.

We now describe embodiments of the calculations or computations that are performed when determining one or more mask patterns and/or one or more write patterns. In some embodiments, these calculations include an inverse calculation in which a target or acceptable wafer pattern at an image plane of an optical system is used to determine a given write beam (and thus, a given write pattern) at an object plane or the projection of a given mask pattern at the object plane. For example, the inverse calculations may include an inverse lithography (ILT) calculation. However, in some embodiments the calculation includes an image-based optical proximity correction. Furthermore, in some embodiments the calculations include determining an estimated wafer pattern using a model of the lithographic process. This model may include a photo-resist model of a photo-resist used in the multiple-exposure photolithographic process or the multiple-write maskless lithographic process.

Furthermore, in some embodiments of the iterative calculation a gradient of a merit or error function H (which is dependent upon or is a function of the difference between the target pattern and the estimated wafer pattern, and thus is dependent on the given write pattern or the given mask pattern) may be determined. Note that the gradient may be calculated based on a formula obtained by taking the derivative of the merit or error function H.

In some embodiments, the inverse calculation may be based on minimization of the error function (which is also sometimes referred to as a cost function or a Hamiltonian function). During each iteration of the calculation, the error function may be a function of the difference between the estimated wafer pattern that results when an image associated with the given write pattern or the given mask pattern is projected through an optical path in the optical system during a lithographic process. In some embodiments, multiple images may be used, such as those corresponding to a range of process conditions or multiple exposures.

A forward calculation may also be used when determining the error function. In the discussion that follows, coherent illumination by an illumination pattern associated with the source in the lithographic process is assumed. Furthermore, the electric field falling on the photo-mask (which is associated with the given mask pattern) or provided by a write device (based on the given write pattern) is approximately constant. Using photo-lithography as an example, note that some regions of the given photo-mask (such as those corresponding to '0s' in a binary mask pattern) reflect (such as with a photo-mask for use with light having wavelengths in the extreme ultraviolet) or transmit the light to the semiconductor wafer at the image plane of the optical system, while other regions (such as those corresponding to '1s' in the binary mask pattern) do not reflect or transmit the light to the semiconductor wafer. It follows that a scalar electric field E after reflection off of or transmission through the given photo-mask (which is henceforth referred to as an image pattern), may be expressed as $$E(\vec{r}) = \begin{Bmatrix} 0 \\ 1 \end{Bmatrix},$$

where $\vec{r}=(x, y)$ is a point on the (x,y) plane. (More generally, the electric field may include grayscale values in the range $\{-1, 1\}$ or arbitrary complex numbers that correspond to the features of the given photo-mask. Thus, chrome-on-glass photo-masks and various types of photo-masks other than chrome on glass, such as attenuated phase shifting, strong phase shifting, other materials, etc., are within the scope of the present invention.) Note that this representation of the image pattern may be re-expressed using a function φ (referred to as a level-set function) having positive regions that indicate light reflected or transmitted to the semiconductor wafer and negative regions that indicate an absence of light reflected or transmitted to the semiconductor wafer. (More generally, the level-set function may have two or more levels and the given mask pattern or the given write pattern may be represented by one or more level-set functions.) Furthermore, the level-set function may equal zero at the boundaries or contours of features of the given photo-mask. Therefore, the electric field E associated with the given photo-mask (and thus, the given mask pattern) may be re-expressed as a function of this level-set function, i.e., $$E(\vec{r})=\hat{h}(\varphi(x,y)),$$

where $\hat{h}$ is a transmission or reflection function $$\hat{h}(x) = \begin{Bmatrix} 1 & x \geq 0 \\ 0 & x < 0 \end{Bmatrix}.$$

Since an ideal diffraction limited lens acts as a low-pass filter, this may be used as an approximation to the actual (almost but not quite perfect) optics in the optical path in the optical system. Mathematically, the action of a lens may be expressed as $$A(\vec{r})=f^{-1}(\hat{C}(f(E(\vec{r}))))$$

where $A(\vec{r})$ indicates the electric field distribution on the wafer, f indicates the Fourier transform, $f^{-1}$ indicates the inverse Fourier transform, and $\hat{C}$ indicates the pupil cutoff function, which is zero for frequencies larger than a threshold determined by the numerical aperture (NA) of the lens, and one otherwise. Thus, the pupil function is $$\hat{C}(k_x, k_y) = \hat{h}(k_{max}^2 - [k_x^2 + k_y^2])$$
$$= \begin{Bmatrix} 0 & k_x^2 + k_y^2 \geq k_{max}^2 \\ 1 & k_x^2 + k_y^2 < k_{max}^2 \end{Bmatrix},$$

wherein $k_x$, $k_y$ and $k_{max}$ represent frequency coordinates in Fourier space. Therefore, the intensity pattern on the semiconductor wafer is simply the square of the electric field $$I(\vec{r})=|A(\vec{r})|^2.$$

Combining these two equations, we find $$F(\varphi(x,y))=(|f^{-1}(\hat{C}(f(\hat{h}(\varphi(x,y)))))|^2).$$

This is a self-contained formula for the intensity pattern at the semiconductor wafer.

Note that this is just one embodiment of the forward calculation that can be used within the scope of this invention, chosen by way of example due to its relative simplicity. More sophisticated forward models also fall within the scope of the present invention. Such models may take into account, by way of example but not limitation, various illumination conditions (e.g., off-axis, incoherent), the actual electromagnetics of the light field interacting with the given photo-mask, the polarization of the light field, the actual properties of the lens (such as aberrations), and/or the vector nature of the electromagnetic field as it propagates through the optical path in the optical system during the lithographic process.

In some embodiments, during each iteration of the inverse calculation the level-set function corresponding to the given mask pattern and/or the given write pattern is updated according to $$\varphi_{i+1}=\varphi_i+\Delta\varphi=\varphi_i+\Delta t\cdot\nabla(H),$$

where $\varphi_{i+1}$ is an updated version of the level-set function, $\varphi_i$ is the current version of the level-set function, $\Delta t$ is a step size in the calculation and $\nabla(H)$ is a gradient or a derivative of the error function. Note that $\nabla(H)$ is $$\left.\frac{\delta H}{\delta \varphi}\right|_{\varphi_i},$$

i.e., it is the Frechet derivative of the error function H. Furthermore, in some embodiments $\nabla(H)$ is the direction of steepest descent for minimizing or optimizing H by changing φ. Moreover, in some embodiments a $1^{st}$ order and/or a $3^{rd}$ order Runge-Kutta method is used when updating $\varphi_i$. In other embodiments, a Conjugate Gradient technique, a Levenberg-Marquardt technique, a Quasi-Newton technique, and/or a Simplex technique may be used.

At least some aspects of Simulated Annealing may be utilized in some embodiments of the inverse calculation. In particular, the error function H may be allowed to increase during some iterations as the calculation evolves. In this way, the global minimum in the multi-dimensional space may be determined. Note that the size of this multi-dimensional space is proportional to a number of quantization levels to the power of the number of pixels in the given mask pattern or the given write pattern. In an example embodiment, these patterns or images have at least 1 million pixels (for example, 1024×1024).

In some embodiments, the inverse calculation is run for 100, 1000 or 10,000 iterations at which point the optimal solution has been determined. In other embodiments, the calculation is stopped based on convergence criteria, such as: oscillatory behavior, a relative and/or absolute difference between the estimated wafer pattern and the target pattern, the latest change to the error function H, and/or the history of changes to the error function H. For example, the relative difference may be less than 1% and/or the absolute difference may be 10 nm for a critical dimension of 100 nm.

In some embodiments, the inverse calculation is divided into a series of overlapping work units, at least some of which are processed independently and/or concurrently by a group of processors and/or processor cores. These work units may be based on features or structures (for example, repetitive structures) in the given mask pattern or the given write pattern.

Note that the group of processors and/or processor cores may be distributed over multiple computers or servers, and may also be dispersed over multiple locations. In addition, computations may be implemented in computers or servers that are coupled via a network (such as the Internet and/or an intranet). After these work-unit calculations have been completed, the resulting sub-patterns may be combined to generate the given mask pattern and/or the given write pattern.

In some embodiments, prior to determining the given mask pattern and/or the given write pattern, the target pattern is converted from a first or initial format into a second format. For example, the initial format may be hierarchical, such as one compatible with GDSII, OASIS, and/or another polygon-type format. The second format may be a hierarchy with two levels, a top level and everything else (more generally, the second format may have fewer levels than the initial format). In such a hierarchy, the processing of a cell instance does not depend on the processing of any other cell instance. Thus, in theory all of the instances may be processed in parallel. Note that in some embodiments the initial format and/or the second format may include a pixel-based format (i.e., spatially discrete), data patterns (such as bitmap and/or grayscale images), binary patterns, and/or continuous-tone patterns. Note that after the calculations have been completed, a format of the given write pattern and/or the given mask pattern may be converted back to the initial format.

Figure 7:
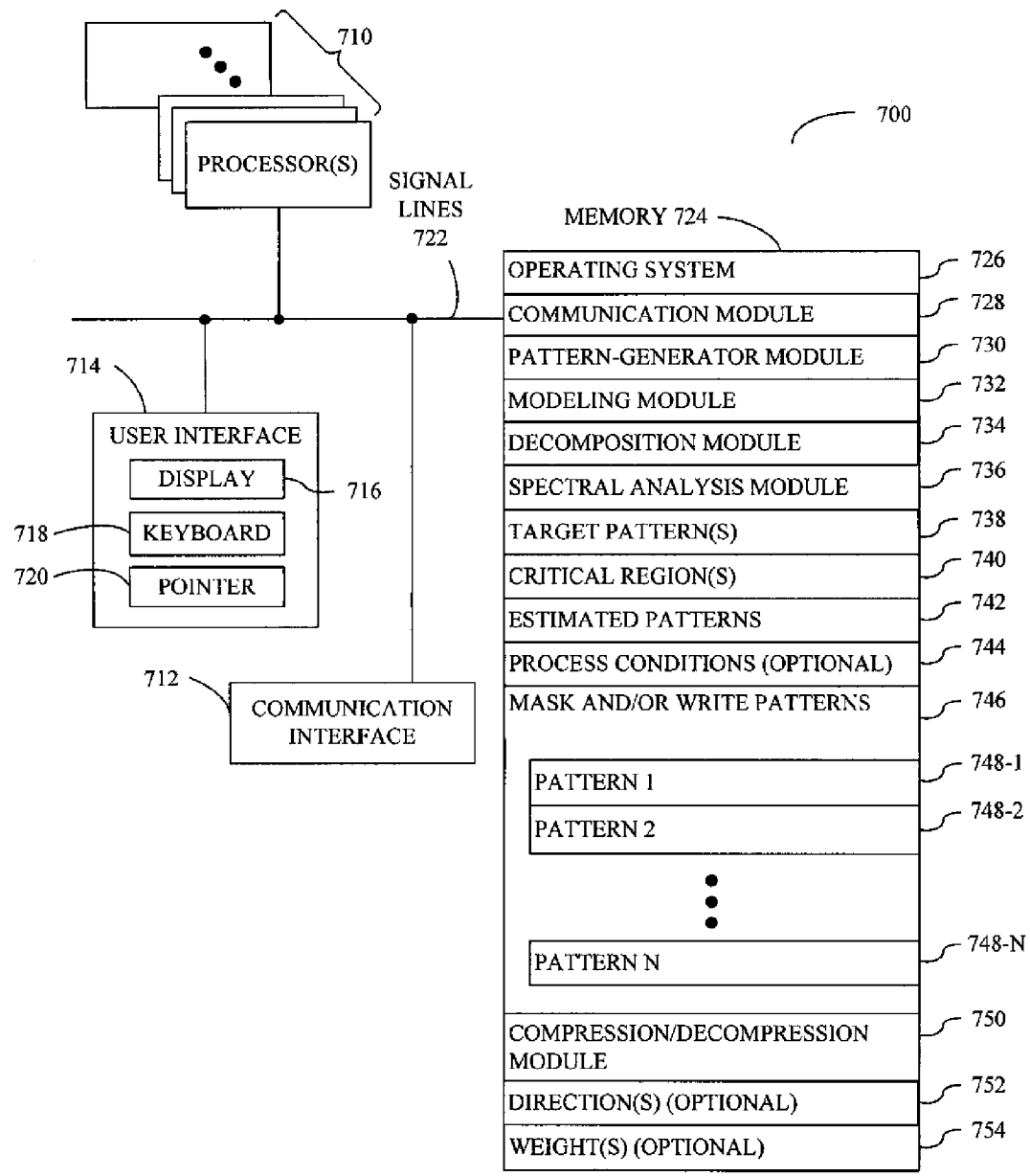
FIG. 7 is a block diagram illustrating a computer system to determine mask patterns and/or write patterns in accordance with an embodiment of the present invention.

We now describe embodiments of a computer system that determines the write patterns and/or the mask patterns. FIG. 7 presents a block diagram illustrating an embodiment of a computer system 700 to determine mask patterns and/or write patterns. Computer system 700 includes multiple processors 710 or processor cores, a communication interface 712, a user interface 714, and one or more signal lines 722 coupling these components together. Note that the processing units 710 support parallel processing and/or multi-threaded operation, the communication interface 712 may have a persistent communication connection, and the one or more signal lines 722 may constitute a communication bus. Moreover, the user interface 714 may include a display 716, a keyboard 718, and/or a pointer 720, such as a mouse.

Memory 724 in the computer system 700 may include volatile memory and/or non-volatile memory. More specifically, memory 724 may include: ROM, RAM, EPROM, EEPROM, FLASH, one or more smart cards, one or more magnetic disc storage devices, and/or one or more optical storage devices. Memory 724 may store an operating system 726 that includes procedures (or a set of instructions) for handling various basic system services for performing hardware dependent tasks. The memory 724 may also store communications procedures (or a set of instructions) in a communication module 728. The communication procedures may be used for communicating with one or more computers, devices and/or servers, including computers, devices and/or servers that are remotely located with respect to the computer system 700.

Memory 724 may also include one or more program modules (or a set of instructions), including: pattern-generator module 730 (or a set of instructions), modeling module 732 (or a set of instructions), decomposition module 734 (or a set of instructions), spectral analysis module 736 (or a set of instructions), and/or compression/decompression module 750 (or a set of instructions).

Pattern-generator module 730 may determine an initial mask or write pattern, which may be stored in mask and/or write patterns 746 (such as one of patterns 748). Note that the determining may be based on one or more target patterns 738 and may involve modeling of an optical path and/or a photoresist using modeling module 732, which may determine one or more estimated patterns 742. In some embodiments, the determining may be based on one or more optional process conditions 744.

Alternatively, computer system 700 may receive the initial mask or write pattern from a remote location, or may obtain the initial mask or write pattern from memory, such as memory 724.

In some embodiments, spectral analysis module 736 may determine one or more characteristics in the initial write pattern and/or the initial mask pattern, such as one or more optional directions 752 and/or a maximum spectral frequency along at least one of the optional directions 752. Decomposition module 734 may use this information when identifying one or more critical regions 740 in the initial write pattern and/or the initial mask pattern, and may then determine two or more write patterns and/or mask patterns, which may be used in multiple-exposure or multiple-write lithographic processes. Note that the determining of the two or more write patterns and/or mask patterns may be based on optional weights 754. Moreover, the determined write patterns and/or mask patterns may be stored in mask and/or write patterns 746. In some embodiments, the two or more write patterns and/or mask patterns may be compressed and/or decompressed using compression/decompression module 750.

Instructions in the various modules in the memory 724 may be implemented in: a high-level procedural language, an object-oriented programming language, and/or in an assembly or machine language. The programming language may be compiled or interpreted, i.e., configurable or configured to be executed by the processing units 710.

Although the computer system 700 is illustrated as having a number of discrete components, FIG. 7 is intended to be a functional description of the various features that may be present in the computer system 700 rather than as a structural schematic of the embodiments described herein. In practice, and as recognized by those of ordinary skill in the art, the functions of the computer system 700 may be distributed over a large number of servers or computers, with various groups of the servers or computers performing particular subsets of the functions. In some embodiments, some or all of the functionality of the computer system 700 may be implemented in one or more ASICs and/or one or more digital signal processors DSPs.

Note that computer system 700 may include fewer components or additional components. Moreover, two or more components may be combined into a single component, and/or a position of one or more components may be changed. In some embodiments the functionality of computer system 700 may be implemented more in hardware and less in software, or less in hardware and more in software, as is known in the art.

Figure 8:
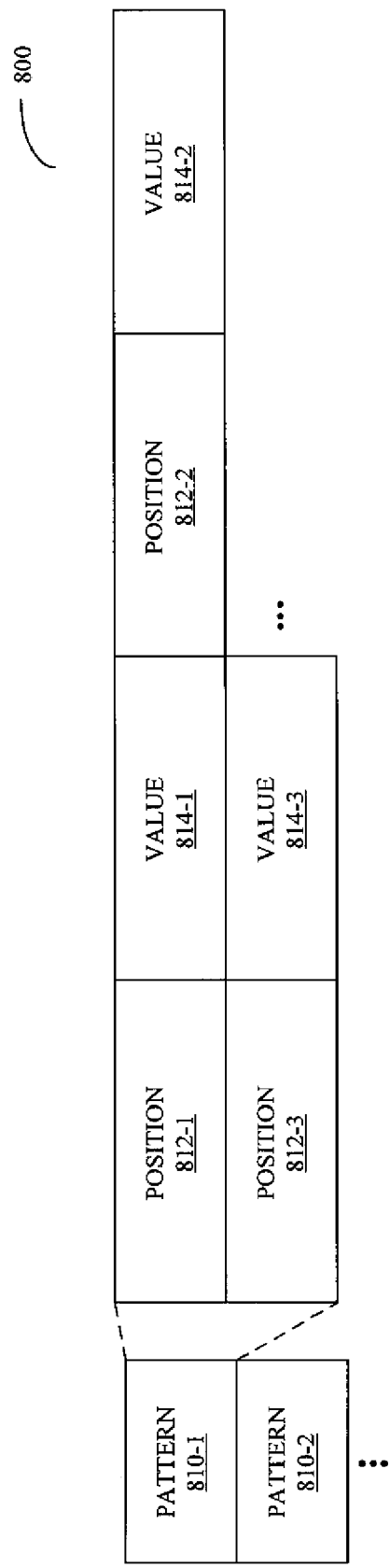
FIG. 8 is a block diagram illustrating a data structure in accordance with an embodiment of the present invention.

We now describe embodiments of a data structure that may be used in the computer system 700. FIG. 8 presents a block diagram illustrating an embodiment of a data structure 800. This data structure may include patterns 810, such as mask patterns and/or write patterns. A given pattern, such as pattern 810-1, may include multiple pairs of positions 812 and associated values 814 in the pattern 810-1. Note that in some embodiments of the data structure 800 there may be fewer or additional components. Moreover, two or more components may be combined into a single component, and/or a position of one or more components may be changed.

While the preceding discussion has used double exposure or double patterning as illustrative examples, in other embodiments there may be additional exposure or patterning operations. For example, an initial mask pattern may be decomposed into three or more mask patterns that may be used in a multiple-exposure photo-lithographic process. Moreover, while the preceding discussion has decomposed an initial mask pattern or write pattern, in other embodiments the sub-patterns may be determined directly based on the target pattern (i.e., without determining and/or using the initial mask pattern or the initial write pattern).

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

While preferred embodiments of the present invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein may be employed in practicing the invention. It is intended that the following claims define the scope of the invention and that methods and structures within the scope of these claims and their equivalents be covered thereby.

What is claimed is:

1. A computer-implemented method for determining mask patterns to be used on photo-masks in a multiple-exposure photolithographic process, comprising:
    receiving a target pattern;
    identifying, using the computer, a critical region in an initial mask pattern, wherein an initial photo-mask corresponding to the initial mask pattern is configured to print a wafer pattern, which corresponds to the target pattern, during a single-exposure photolithographic process, and wherein the critical region includes a location in the initial mask pattern that can be difficult to print in the wafer pattern during the single-exposure photolithographic process; and
    determining a first mask pattern and a second mask pattern based on the initial mask pattern and the target pattern, wherein the first mask pattern and the second mask pattern have at least one decreased spatial frequency relative to the initial mask pattern along at least one direction in the initial mask pattern;
    wherein the first mask pattern includes a first feature and the second mask pattern includes a second feature, and the first feature and the second feature overlap an intersection between features proximate to the critical region in the initial mask pattern; and
    wherein a first photo-mask corresponding to the first mask pattern and a second photo-mask corresponding to the second mask pattern are to print another wafer pattern, which corresponds to the target pattern, during the multiple-exposure photolithographic process.

2. The method of claim 1, further comprising receiving the initial mask pattern.

3. The method of claim 1, further comprising determining the initial mask pattern.

4. The method of claim 1, wherein identifying the critical region involves analysis of spatial frequency components in the initial mask pattern.

5. The method of claim 4, wherein the analysis of the spatial frequency components involves identifying a maximum spatial frequency in the initial mask pattern.

6. The method of claim 4, wherein the analysis of the spatial frequency components involves identifying at least the one direction in the initial mask pattern.

7. The method of claim 1, wherein the multiple-exposure photolithographic process includes a double-exposure photolithographic process in which the other wafer pattern is to be printed by sequentially exposing a wafer using the first photo-mask and, then, the second photo-mask.

8. The method of claim 1, wherein the multiple-exposure photolithographic process includes a double-patterning photolithographic process in which the other wafer pattern is to be printed by sequentially exposing and developing a wafer using the first photo-mask and, then, the second photo-mask.

9. The method of claim 1, wherein the amount of overlap is based on an optical interaction length in the multiple-exposure photolithographic process.

10. The method of claim 1, wherein the optical interaction length corresponds to a ratio of a wavelength of a light source in the multiple-exposure photolithographic process and a numerical aperture in an optical path in the multiple-exposure photolithographic process.

11. The method of claim 1, wherein a first region in the first mask pattern has a first weight and a second region in the second mask pattern has a second weight;
    wherein the first region and the second region correspond to the critical region; and
    wherein the first weight and the second weight determine relative contributions of the first mask pattern and the second mask pattern to the other wafer pattern during the multiple-exposure photolithographic process.

12. The method of claim 11, wherein the first weight and the second weight are each approximately 50%.

13. The method of claim 11, wherein the first weight and the second weight are different than each other; and
    wherein the first weight and the second weight are each less than 100%.

14. The method of claim 11, wherein the first weight and the second weight are associated with sizes of features in the first region and the second region.

15. The method of claim 11, wherein weights outside of the first region in the first mask pattern and the second region in the second mask pattern are each approximately 100%.

16. The method of claim 1, wherein the first mask pattern includes predominantly features along a first direction in the initial mask pattern; and
   wherein the second mask pattern includes predominantly features along a second direction in the initial mask pattern.

17. The method of claim 16, wherein the first direction and the second direction are approximately perpendicular.

18. The method of claim 1, wherein the features in the initial mask pattern include a first portion of a feature and a second portion of the feature; and
   wherein the intersection of the features in the initial mask pattern includes a boundary separating the first portion of the feature and the second portion.

19. The method of claim 1, wherein the first mask pattern and the second mask pattern are determined using an inverse optical calculation based on the target pattern and a model of an optical path that corresponds to an optical system in the multiple-exposure photolithographic process; and
   wherein the target pattern is at an image plane in the model of the optical path and the first mask pattern and the second mask pattern are at an object plane in the model of the optical path.

20. The method of claim 19, wherein the first mask pattern and the second mask pattern are further determined based on an estimate of the other wafer pattern; and
   wherein the estimate of the other wafer pattern is at an image plane in the model of the optical path.

21. The method of claim 20, wherein the estimate of the other wafer pattern is based on a model of a photo-resist used in the multiple-exposure photolithographic process.

22. A computer-program product for use in conjunction with a computer system, the computer-program product comprising a non-transitory computer-readable storage medium and a computer-program mechanism embedded therein for determining mask patterns to be used on photo-masks in a multiple-exposure photolithographic process, the computer-program mechanism including:
   instructions for receiving a target pattern;
   instructions for identifying a critical region in an initial mask pattern, wherein an initial photo-mask corresponding to the initial mask pattern is configured to print a wafer pattern, which corresponds to the target pattern, during a single-exposure photolithographic process, and wherein the critical region includes a location in the initial mask pattern that can be difficult to print in the wafer pattern during the single-exposure photolithographic process; and
   instructions for determining a first mask pattern and a second mask pattern based on the initial mask pattern and the target pattern, wherein the first mask pattern and the second mask pattern have at least one decreased spatial frequency relative to the initial mask pattern along at least one direction in the initial mask pattern;
   wherein the first mask pattern includes a first feature and the second mask pattern includes a second feature, and the first feature and the second feature overlap an intersection between features proximate to the critical region in the initial mask pattern; and
   wherein a first photo-mask corresponding to the first mask pattern and a second photo-mask corresponding to the second mask pattern are to print another wafer pattern, which corresponds to the target pattern, during the multiple-exposure photolithographic process.

23. A computer system, comprising:
at least one processor;
at least one memory; and
at least one program module for determining mask patterns to be used on photo-masks in a multiple-exposure photolithographic process, the program module stored in the memory and configured to be executed by the processor, the program module including:
   instructions for receiving a target pattern;
   instructions for identifying a critical region in an initial mask pattern, wherein an initial photo-mask corresponding to the initial mask pattern is configured to print a wafer pattern, which corresponds to the target pattern, during a single-exposure photolithographic process, and wherein the critical region includes a location in the initial mask pattern that can be difficult to print in the wafer pattern during the single-exposure photolithographic process; and
   instructions for determining a first mask pattern and a second mask pattern based on the initial mask pattern and the target pattern, wherein the first mask pattern and the second mask pattern have at least one decreased spatial frequency relative to the initial mask pattern along at least one direction in the initial mask pattern;
   wherein the first mask pattern includes a first feature and the second mask pattern includes a second feature, and the first feature and the second feature overlap an intersection between features proximate to the critical region in the initial mask pattern; and
   wherein a first photo-mask corresponding to the first mask pattern and a second photo-mask corresponding to the second mask pattern are to print another wafer pattern, which corresponds to the target pattern, during the multiple-exposure photolithographic process.

* * * * *